United States Patent
Kang et al.

(10) Patent No.: US 11,233,961 B2
(45) Date of Patent: Jan. 25, 2022

(54) IMAGE PROCESSING SYSTEM FOR MEASURING DEPTH AND OPERATING METHOD OF THE SAME

(71) Applicant: SAMSUNG ELECTRONICS CO., LTD., Suwon-si (KR)

(72) Inventors: Hee Kang, Hwaseong-si (KR); Youngjun Song, Seoul (KR); Seokjae Kang, Seoul (KR); Taeksun Kim, Hwaseong-si (KR); Dongki Min, Seoul (KR); Jongmin You, Seongnam-si (KR); Jeehong Lee, Seoul (KR); Joonhyuk Im, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 2 days.

(21) Appl. No.: 16/595,798

(22) Filed: Oct. 8, 2019

(65) Prior Publication Data

US 2020/0260029 A1    Aug. 13, 2020

(30) Foreign Application Priority Data

Feb. 8, 2019    (KR) .......................... 10-2019-0015109

(51) Int. Cl.
*H04N 5/369*  (2011.01)
*H04N 13/246* (2018.01)
*H04N 5/232*  (2006.01)
*H04N 13/00*  (2018.01)

(52) U.S. Cl.
CPC ... *H04N 5/36965* (2018.08); *H04N 5/232122* (2018.08); *H04N 13/246* (2018.05); *H04N 2013/0081* (2013.01)

(58) Field of Classification Search
None
See application file for complete search history.

(56) References Cited

U.S. PATENT DOCUMENTS

| | | | |
|---|---|---|---|
| 8,736,683 B2 | 5/2014 | Cao et al. | |
| 9,445,018 B2 | 9/2016 | Fettig et al. | |
| 9,445,072 B2 | 9/2016 | Stefanoski et al. | |
| 9,591,282 B2 | 3/2017 | Hyodo et al. | |
| 9,628,695 B2 | 4/2017 | Somanath et al. | |
| 9,761,058 B2 | 9/2017 | Wen et al. | |
| 10,091,409 B2 | 10/2018 | Govindarao et al. | |
| 2012/0007954 A1 | 1/2012 | Miller et al. | |
| 2012/0033051 A1* | 2/2012 | Atanassov ........... | H04N 13/239 348/49 |
| 2013/0182125 A1 | 7/2013 | Hyun | |

(Continued)

FOREIGN PATENT DOCUMENTS

| | | |
|---|---|---|
| CN | 109257586 A | 1/2019 |
| KR | 10-2019-0008057 A | 1/2019 |

*Primary Examiner* — Heather R Jones
(74) *Attorney, Agent, or Firm* — Sughrue Mion, PLLC

(57) ABSTRACT

An image processing system includes a movable lens that transfers an external light, an image sensor that includes a pixel array that generates an image signal based on the light and generates image data based on the image signal, and a processor that generates focus information for controlling a position of the movable lens and that generates a depth map based on calibration data and the image data. The calibration data include a value that depends on a position of the objective lens and a position of a pixel included in the pixel array.

20 Claims, 10 Drawing Sheets

(56) References Cited

U.S. PATENT DOCUMENTS

2016/0284090 A1* 9/2016 Huang .................... G06T 7/593
2017/0223339 A1* 8/2017 Kondo ................... G01B 11/00
2018/0176452 A1* 6/2018 Nikkanen ............ H04N 5/3696
2019/0020865 A1    1/2019 Kang et al.
2020/0221064 A1* 7/2020 Yerushalmy ......... H04N 13/128

* cited by examiner

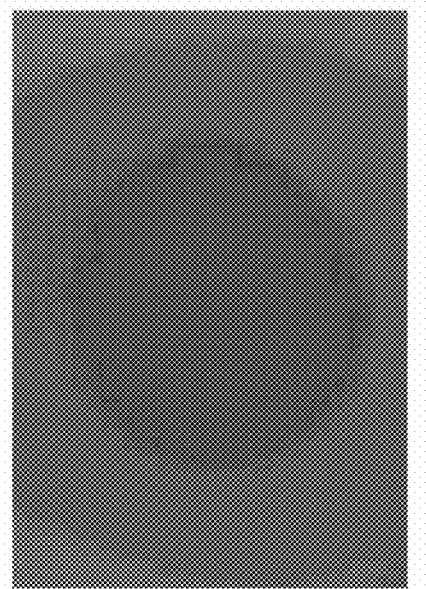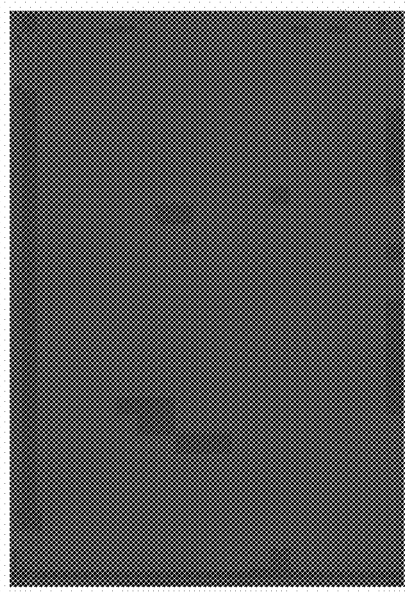
FIG. 8

IMAGE PROCESSING SYSTEM FOR MEASURING DEPTH AND OPERATING METHOD OF THE SAME

CROSS-REFERENCE TO RELATED APPLICATIONS

This application is based on and claims priority under 35 U.S.C. § 119 to Korean Patent Application No. 10-2019-0015109 filed on Feb. 8, 2019, in the Korean Intellectual Property Office, the disclosures of which are incorporated by reference herein in their entireties.

BACKGROUND

Embodiments of the disclosure described herein relate to image processing, and more particularly, relate to an image processing system for measuring a depth and an operating method thereof.

Due to a demand on photographing an external image, an electronic device, such as a smartphone, a smart television (TV), or a personal computer (PC), as well as a digital camera or a digital camcorder are equipped with an image sensor. The electronic device may perform image processing for the purpose of displaying or obtaining an image. To this end, the electronic device may include an image signal processor.

A recent image processing system may perform multi-purpose image processing. For example, an image obtained from the outside may be used to measure a distance between an object and the image processing system. To this end, the image processing system may generate a depth map including information about a distance. For example, the depth map may be utilized to generate a three-dimensional image.

Various devices and methods are being used to generate the depth map. For example, the depth map may be generated by monitoring a waveform of a light reflected from an object after a light having a specific waveform is emitted to the object, measuring a time when the light is emitted and then returns, or obtaining stereo information through a plurality of cameras. Nowadays, a way to generate a depth map by using a phase difference (i.e., disparity) between images obtained by one camera is on the spotlight, and there is a demand on improving accuracy of the depth map.

SUMMARY

Embodiments of the disclosure provide an image processing system for improving disparity distortion according to a position of a pixel and for measuring a depth based on a change in the disparity according to a position of an objective lens, and an operating method thereof.

According to an aspect of the disclosure, there is provided an image processing system comprising: a movable lens configured to transfer an external light; an image sensor comprising a pixel array configured to generate an image signal based on the light, the image sensor configured to generate image data based on the image signal; and a processor configured to generate focus information for controlling a position of the movable lens and to generate a depth map based on calibration data and the image data, wherein the calibration data comprises a value based on the position of the movable lens and a position of a pixel included in the pixel array.

According to another aspect of the disclosure, there is provided an operating method of an image processing system, the method comprising: capturing a target image through a movable lens at a first position to generate first image data; capturing the target image through the movable lens at a second position to generate second image data; calculating a first disparity value based on a position of a pixel included in an image sensor, and based on the first image data; calculating a second disparity value based on the position of the pixel, and based on the second image data; calculating a disparity change rate according to a position of the movable lens, based on the first and second disparity values; and generating calibration data based on the disparity change rate.

According to another aspect of the disclosure, there is provided an operating method of an image processing system, the method comprising: capturing an external image with an image sensor comprising a plurality of pixels to generate image data; generating a disparity range, based on calibration data and a position of a movable lens in capturing the external image; generating a cost function corresponding to the disparity range; and generating a depth map, based on the cost function and the calibration data, wherein the calibration data comprises a disparity change rate according to a position of the plurality of pixels and the position of the movable lens.

BRIEF DESCRIPTION OF THE FIGURES

The above and other objects and features of the disclosure will become apparent by describing in detail exemplary embodiments thereof with reference to the accompanying drawings.

FIG. 8 is a diagram illustrating a disparity map for describing disparity distortion according to a position of a pixel.

DETAILED DESCRIPTION

Below, embodiments of the disclosure will be described clearly and in detail with reference to accompanying drawings to such an extent that an ordinary one in the art implements embodiments of the disclosure.

Figure 1:
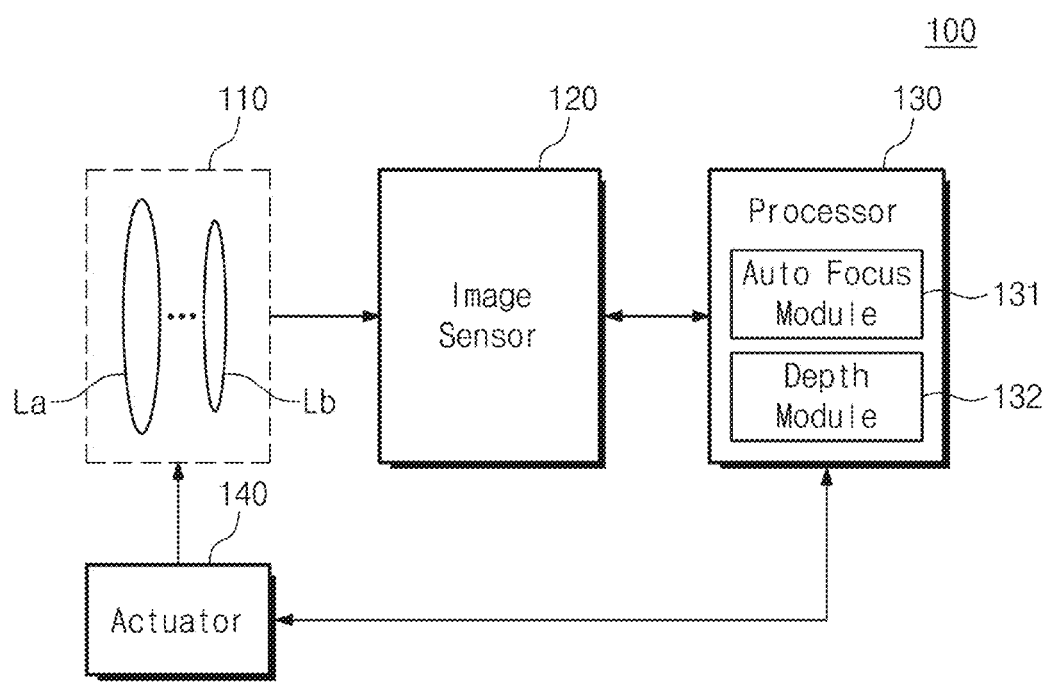
FIG. 1 is a block diagram illustrating an image processing system according to an embodiment of the disclosure.

FIG. 1 is a block diagram illustrating an image processing system according to an embodiment of the disclosure. Referring to FIG. 1, an image processing system 100 may include a lens unit 110, an image sensor 120, a processor 130, and an actuator 140. The image processing system 100 may be configured to obtain an image of the outside and to process and store the obtained image. According to an embodiment, the image processing system 100 is configured to capture an image of the environment external to the image processing system 100.

The lens unit 110 may refract an external light so as to be transferred to the image sensor 120. The external light may be a light that is emitted from one or more light sources and is then reflected by an object. The lens unit 110 may refract a light such that an external object is focused on. To this end, the lens unit 110 may include a plurality of objective lenses La and Lb. A focus for obtaining an image of an object may vary with a distance between the object and the image processing system 100. To this end, at least one of the plurality of objective lenses La and Lb may move. According to an embodiment, one or more of the plurality of objective lenses La and Lb may be independently movable.

To focus on an object, the at least one objective lens may move such that a distance from the image sensor 120 increases or decreases. As a distance from the object to an objective lens increases, a position of an image surface corresponding to the object may become closer to the lens unit 110. That is, as a distance from the object from the image processing system 100 increases, to focus on the object, at least one objective lens may move such that the at least one objective lens becomes closer to the image sensor 120. At least one objective lens may move based on focus information, under control of the actuator 140. The focus information may be generated by the processor 130.

The image sensor 120 generates image data based on a light transferred from the lens unit 110. The image sensor 120 may sense a light and may convert the sensed light to an image signal being an electrical signal. To this end, the image sensor 120 may include a pixel array that includes a plurality of pixels. The image sensor 120 may convert the image signal being the analog signal to image data being a digital signal.

Each of the plurality of pixels may include a plurality of photo diodes for the purpose of measuring a position or a depth of an object. For example, it is assumed that each of the plurality of pixels includes a first photo diode and a second photo diode. A first image (e.g., a left image) may be generated by data that are generated from the first photo diodes of the plurality of pixels, and a second image (e.g., a right image) may be generated data that are generated by the second photo diodes thereof. Here, the first and second images are included in image data. A phase difference (or a disparity) between the first image and the second image may be used to measure a depth of the object.

The processor 130 may perform various image processing based on image data. The processor 130 may perform operations for various image processing. In a normal operating mode, the processor 130 may allow image data to be displayed through a display device (not illustrated). Also, in an operating mode for measuring a depth of an object, the processor 130 may generate a depth map corresponding to the object. Besides, the processor 130 may perform various operations: an operation of compressing image data and an operation of recognizing an object.

The processor 130 may include an auto focus module 131 and a depth module 132 for the purpose of bringing an object into focus based on a position of the object and measuring a depth of the object. For convenience of description, an example is illustrated in FIG. 1 as the auto focus module 131 and the depth module 132 are separated, but the auto focus module 131 and the depth module 132 may be implemented with one function block. The auto focus module 131 and the depth module 132 may be implemented with hardware or may be implemented with firmware, software, or a combination thereof.

The auto focus module 131 may analyze image data to determine whether an object comes into focus. The auto focus module 131 may generate focus information such that an objective lens moves until an object comes into focus. The auto focus module 131 may determine whether an object comes into focus, based on the above disparity between the first and second images. The disparity may be defined as a difference between a position of one point on the first image (or the second image) and a position of a corresponding point of the second image (or the first image). The auto focus module 131 may determine whether a disparity value satisfies a reference disparity, for the purpose of determining whether an object comes into focus. The reference disparity may be defined as a disparity range where it is determined that an object comes into focus. In the case where an object is out of focus, the auto focus module 131 may provide focus information to the actuator 140 such that a position of an objective lens changes.

The depth module 132 may analyze image data to generate a depth map for an object. The depth module 132 may determine a depth of the object, based on the above disparity between the first and second images. As a distance between an object and the image processing system 100 changes, a disparity value may change. Based on a relationship between the distance between the object and the image processing system 100 and the disparity value, the depth module 132 may measure a depth of the object and may generate a depth map.

The depth module 132 may improve accuracy of the depth map by using calibration data. For example, the depth module 132 may apply a different weight or cost function for each area of the pixel array sensing a light and may generate a depth map. For example, even though an object is at the same distance, disparity values of areas of the pixel array may be differently calculated. For example, a disparity value of images that are generated based on pixels in an area far away from the center of the pixel array may be smaller than a disparity value of images that are generated based on pixels in an area close to the center of the pixel array. The depth module 132 may reduce distortion of this disparity by using calibration data.

The depth module 132 may generate a depth map in consideration of a movement of an objective lens by the auto focus module 131. The calibration data may include information of a disparity change according to a position change of the objective lens. The depth module 132 may calculate a change in disparity distortion according to a movement of the objective lens, by using the calibration data. The depth module 132 may apply the changed disparity distortion to the depth map, thus improving accuracy of the depth map. For example, as a distance from the objective lens to the image sensor 120 increases, a disparity value may increase, and disparity distortion according to a position of a pixel may also change. The calibration data may be generated to calibrate disparity distortion in consideration of both a position of a pixel and a position of an objective lens and may be stored and managed by the processor 130.

The actuator 140 may mechanically control a movement of at least one objective lens of the lens unit 110, based on focus information. For example, the actuator 140 may include a motor for a movement of the objective lens. The actuator 140 may move the objective lens based on the focus information such that an object comes into focus.

Figure 2:
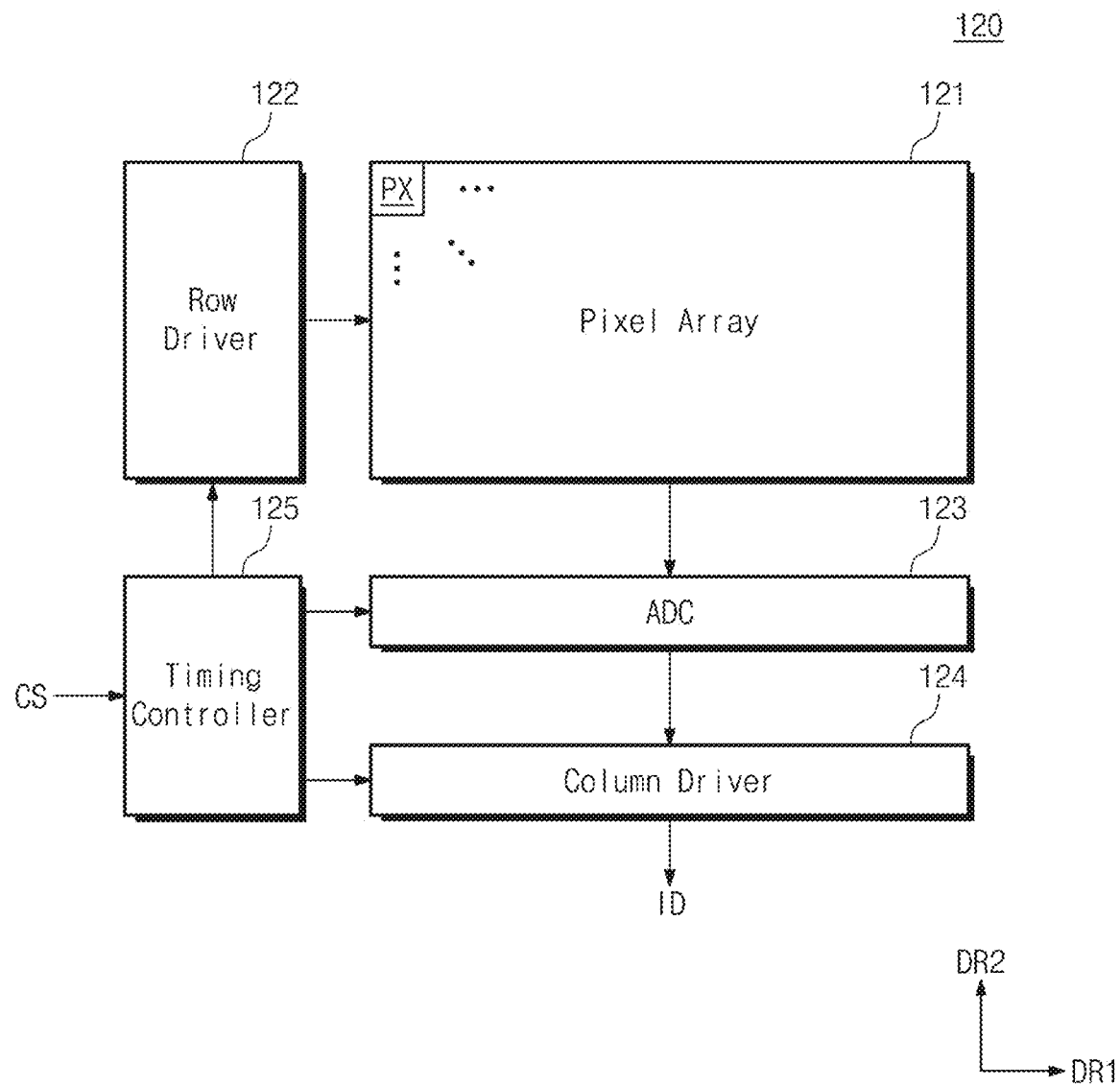
FIG. 2 is a block diagram illustrating an image sensor of FIG. 1.

FIG. 2 is a block diagram illustrating an image sensor of FIG. 1. Referring to FIG. 2, the image sensor 120 may include a pixel array 121, a row driver 122, an analog-to-digital converter circuit 123, a column driver 124, and a timing controller 125. The image sensor 120 of FIG. 2 may be understood as one embodiment, and the image sensor 120 of FIG. 1 is not limited thereto.

The pixel array 121 includes a plurality of pixels PX arranged on a plane defined by a first direction DR1 and a second direction DR2. The first direction DR1 is defined as a row direction, and the second direction DR2 is defined as a column direction. A structure of the plurality of pixels PX will be described with reference to FIGS. 3 and 4. Each of the plurality of pixels PX converts a light signal sensed from the outside to an image signal being an electrical signal. The pixel array 121 outputs a sensed image signal in response to driving signals. The pixel array 121 may provide the sensed image signal to the analog-to-digital converter circuit 123 through a plurality of column lines.

The row driver 122 may select one or more rows included in the pixel array 121. At least a part of pixels PX included in the selected row may provide an image signal to the analog-to-digital converter circuit 123. To this end, the row driver 122 may generate a row selection signal and may provide the row selection signal to the pixel array 121. The row driver 122 may generate the row selection signal under control of the timing controller 125.

The analog-to-digital converter circuit 123 converts the analog signal output from the pixel array 121 into image data ID being a digital signal. The analog-to-digital converter circuit 123 may perform digital sampling on the image signal under control of the timing controller 125.

The column driver 124 may select one or more columns included in the pixel array 121. At least a part of pixels PX included in the selected column may provide an image signal to the analog-to-digital converter circuit 123, and the image data ID generated based on the image signal may be provided to the column driver 124. To this end, the column driver 124 may generate a column selection signal under control of the timing controller 125. The image data ID may be output to the processor 130 of FIG. 1.

The timing controller 125 may control overall operations of the image sensor 120. The timing controller 125 may receive a control signal CS from the processor 130. The timing controller 125 may drive the row driver 122, the analog-to-digital converter circuit 123, and the column driver 124 based on the control signal CS and may drive the image sensor 120.

Figure 3:
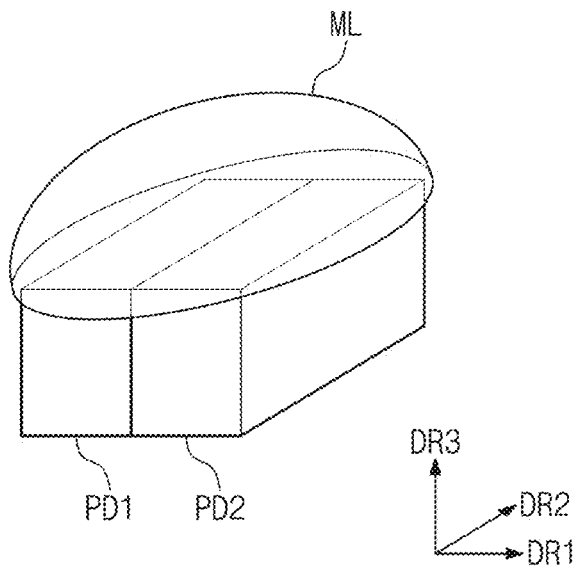
FIGS. 3 and 4 are diagrams illustrating an exemplary structure of pixels included in a pixel array of FIG. 2.

FIG. 3 is a diagram illustrating an exemplary structure of pixels included in a pixel array of FIG. 2. Referring to FIG. 3, a pixel PXa may include a first photo diode PD1, a second photo diode PD2, and a micro lens ML. The pixel PXa of FIG. 3 may be understood as one embodiment, and a structure of the pixel PX of FIG. 2 is not limited thereto. For example, the pixel PXa may further include a color filter (not illustrated).

The first photo diode PD1 and the second photo diode PD2 may be disposed adjacent to each other in the first direction DR1. The first direction DR1 and the second direction DR2 correspond to the first direction DR1 and the second direction DR2 of FIG. 2, respectively. The first and second photo diodes PD1 and PD2 may sense a light incident through the lens unit 110 of FIG. 1 and may convert the sensed light into an image signal being an electrical signal. The first photo diode PD1 may be used to generate a portion of the first image (i.e., the left image) described with reference to FIG. 1. The second photo diode PD2 may be used to generate a portion of the second image (i.e., the right image) described with reference to FIG. 1.

Because positions of the first photo diode PD1 and the second photo diode PD2 are different, the first image and the second image may be different from each other. Similar to an image of a left eye of a human and an image of a right eye of the human being different, the first image from the first photo diode PD1 and the second image from the second photo diode PD2 may be different from each other. A phase difference (or a disparity) between the first image and the second image depends on a distance between an object and the image sensor 120 and may be used to generate a depth map or to perform an auto-focus function. That is, the first and second photo diodes PD1 and PD2 may allow the image sensor 120 to perform a role of a sensor for an auto-focus function. Accordingly, the image processing system 100 of FIG. 1 may measure a depth for the whole external image without a separate phase difference detection sensor for an auto-focus function.

The micro lens ML is disposed on the first and second photo diodes PD1 and PD2 in a third direction DR3 perpendicular to the first and second directions DR1 and DR2. The micro lens ML may concentrate a light incident into the first and second photo diodes PD1 and PD2, thus increasing an effect to sense a light. The micro lens ML may include a plurality of micro lenses provided on the pixel array 121 of FIG. 2.

Figure 4:
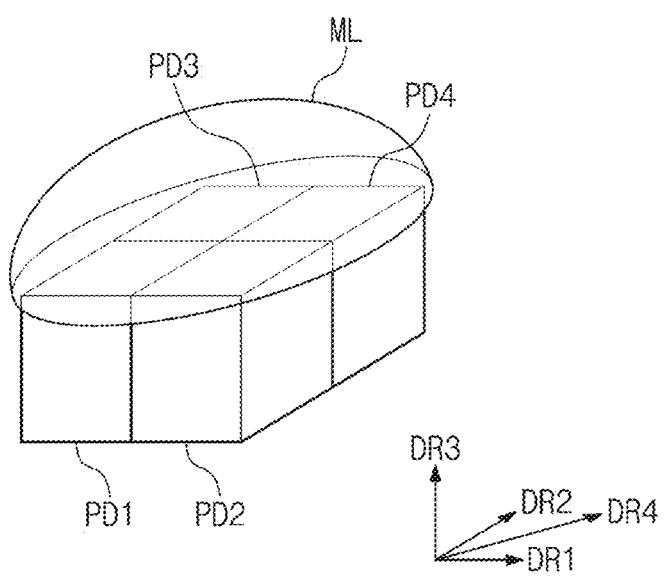

FIG. 4 is a diagram illustrating an exemplary structure of pixels included in a pixel array of FIG. 2. Referring to FIG. 4, a pixel PXb may include first to fourth photo diodes PD1 to PD4 and the micro lens ML. Like FIG. 3, the pixel PXb of FIG. 4 may be understood as one embodiment, and a structure of the pixel PX of FIG. 2 is not limited thereto.

The first and second photo diodes PD1 and PD2 may be disposed adjacent to each other in the first direction DR1. The third photo diode PD3 may be disposed adjacent to the first photo diode PD1 in the second direction DR2. The fourth photo diode PD4 may be disposed adjacent to the second photo diode PD2 in the second direction DR2 and may be disposed adjacent to the third photo diode PD3 in the first direction DR1. The micro lens ML is disposed on the first to fourth photo diodes PD1 to PD4 in the third direction DR3.

The first to fourth photo diodes PD1 to PD4 may be respectively used to generate four different images. Unlike FIG. 3, four images (e.g., first to fourth images) may be generated through the structure of the pixel PXb of FIG. 4. For example, based on at least one of a phase difference between the first and second images, a phase difference between the first and third images, and a phase difference between the first and fourth images, a depth map may be generated, and an auto-focus function may be performed. In this case, the phase differences in the first direction DR1, the second direction DR2, and a fourth direction DR4 may be considered to measure a depth, and thus, a depth of an object may be measured more accurately.

Figure 5:
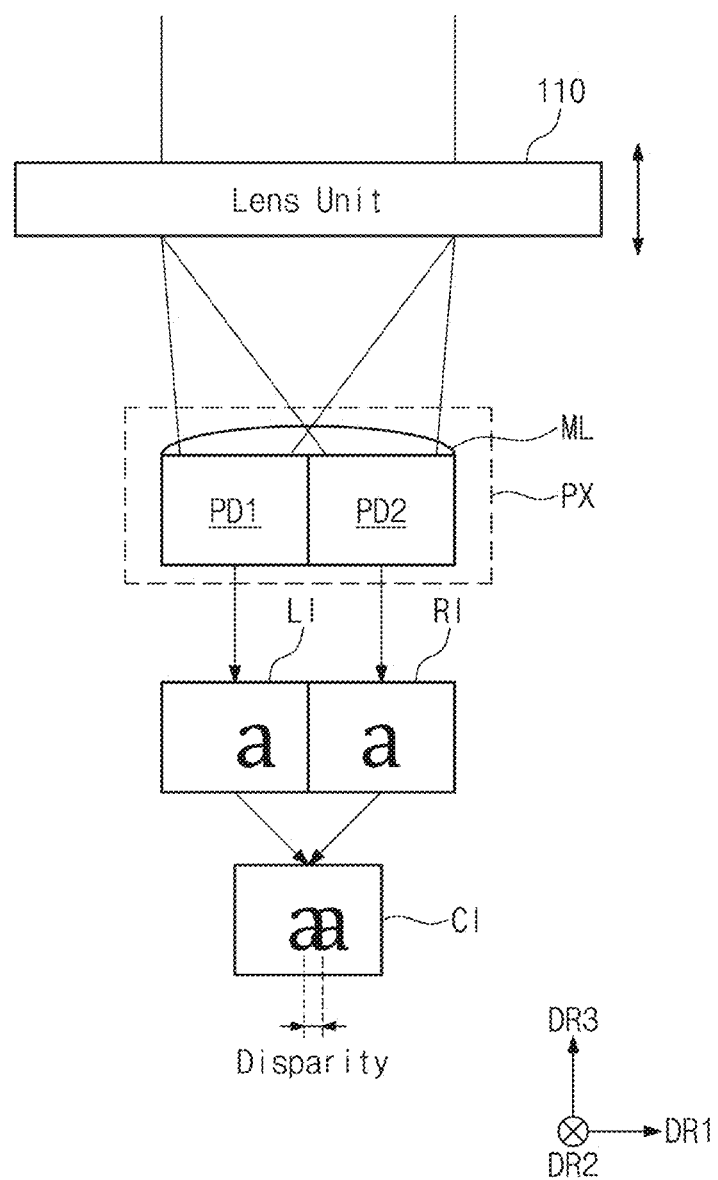
FIG. 5 is a diagram for describing a process in which an image processing system of FIG. 1 performs an auto-focus function.

FIG. 5 is a diagram for describing a process in which an image processing system of FIG. 1 performs an auto-focus function. The lens unit 110 of FIG. 5 corresponds to the lens unit 110 of FIG. 1, and the pixel PX corresponds to the pixel PX of FIG. 2. For convenience of description, FIG. 5 will be described with reference to reference numerals/marks of FIGS. 1 and 2.

The lens unit 110 transfers a light reflected by an object to the pixel array 121. Each of the plurality of pixels PX included in the pixel array 121 senses a light concentrated through the micro lens ML. A first image LI (i.e., a left image) may be generated by image signals that the first photo diodes PD1 included in the pixel array 121 generate. A second image RI (i.e., a right image) may be generated by image signals that the second photo diodes PD2 included in the pixel array 121 generate.

The processor 130 may match the first image LI and the second image RI to each other. Referring to a combined image CI generated as a matching result, the first image LI and the second image RI may be different from each other in position of an exemplary object "a". A disparity may be calculated based on a difference between positions of the object "a". As a distance between an object and the image processing system 100 changes, a disparity value may change. In the case where the disparity value does not satisfy the reference disparity, the processor 130 may determine that the object is out of focus. In this case, the processor 130 may move at least one objective lens included in the lens unit 110. The processor 130 may move the objective lens through the actuator 140 until the disparity value satisfies the reference disparity.

In the case where the pixel PX of FIG. 5 is the pixel Pb of FIG. 4, the image sensor 120 may further generate the third image and the fourth image. The processor 130 may match two images of the first to fourth images to each other. That is, the processor 130 may calculate disparities in various directions to perform an auto-focus function or to generate a depth map.

Figure 6:
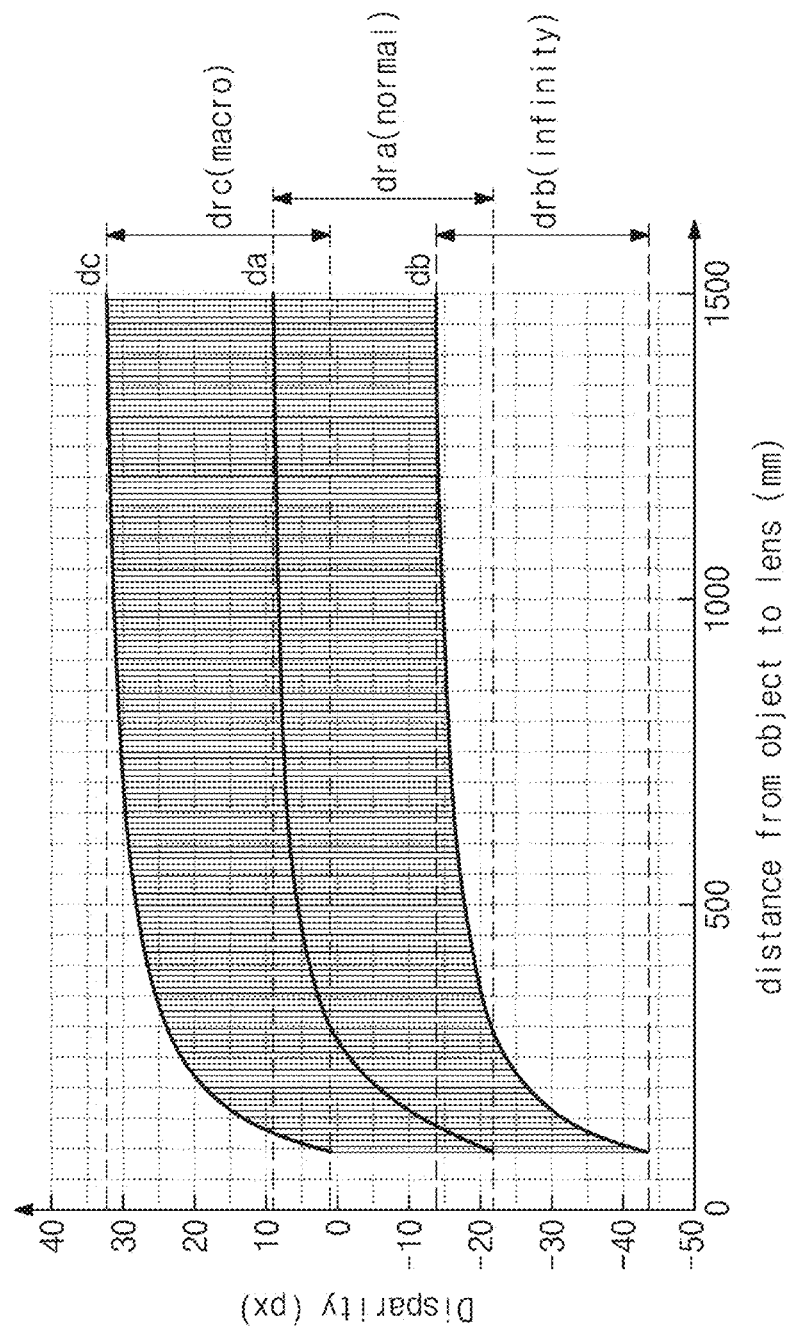
FIG. 6 is a graph for describing a relationship between a distance from an object to an image processing system and a disparity.

FIG. 6 is a graph for describing a relationship between a distance from an object to an image processing system and a disparity. Referring to FIG. 6, a horizontal axis is defined as a distance from an object to the lens unit 110, and a vertical axis is defined as a magnitude of a disparity value of a pixel unit. It may be understood that the disparity value indicates a relative magnitude to a preset disparity value of "0".

As a distance between the object and the image processing system 100 decreases, a disparity value may decrease. Referring to FIG. 5, as a distance between the object and the image processing system 100 decreases, a position of the object "a" in the second image RI may move to the left with respect to the first image LI. This may be described in the graph of FIG. 6 as the disparity value changes to a negative value.

A normal mode may be understood as a mode for a general image capture operation. In this case, it is assumed that a magnitude of the disparity value according to a distance between the object and the image processing system 100 is a first disparity da. The first disparity da may be formed in a first disparity range dra.

An infinity mode may be understood as a mode for a long-distance image capture operation like landscape capturing. That is, this means that a focal position of an objective lens is at a long distance. In this case, it is assumed that a magnitude of the disparity value according to a distance between the object and the image processing system 100 is a second disparity db. The second disparity db may be formed in a second disparity range drb. A value of an upper limit of the second disparity range drb may be smaller than a value of an upper limit of the first disparity range dra, and a value of a lower limit of the second disparity range drb may be smaller than a value of a lower limit of the first disparity range dra. At a position of the same object, a value of the second disparity db may be smaller than a value of the first disparity da.

When a focal position of the objective lens is distant, the first disparity da may be out of the reference disparity, and the second disparity db may satisfy the reference disparity. For example, when the object is spaced from the image processing system 100 as much as 1 m, a disparity in the normal mode may be calculated to be about 10 pixels, and a disparity in the infinity mode may be calculated to be about −15 pixels.

A macro mode may be understood as a mode for a short-distance image capture operation like close-up capturing. In this case, it is assumed that a magnitude of the disparity value according to a distance between the object and the image processing system 100 is a third disparity dc. The third disparity dc may be formed in a third disparity range drc. A value of an upper limit of the third disparity range drc may be greater than the value of the upper limit of the first disparity range dra, and a value of a lower limit of the third disparity range drc may be greater than the value of the lower limit of the first disparity range dra. At a position of the same object, a value of the third disparity dc may be greater than a value of the first disparity da.

When a focal position of the objective lens is at a short distance, the first disparity da may be out of the reference disparity, and the third disparity dc may satisfy the reference disparity. For example, when the object is spaced from the image processing system 100 as much as 1 m, a disparity in the normal mode may be calculated to be about 10 pixels, and a disparity in the macro mode may be calculated to be about 30 pixels.

The image processing system 100 may move an objective lens based on a distance (or a depth) of an object and may automatically bring an object into focus. However, as the objective lens moves, a valid disparity range may change between the first to third disparity ranges dra to drc. In the case where a movement of the objective lens according to an auto-focus function is not considered when the image processing system 100 generates a depth map, a depth corresponding to a disparity value may be differently measured. That is, a correlation between a disparity value and a depth of an object may vary with a position change of the objective lens. The processor 130 of FIG. 1 may manage calibration data in which a change of this correlation is considered.

Figure 7:
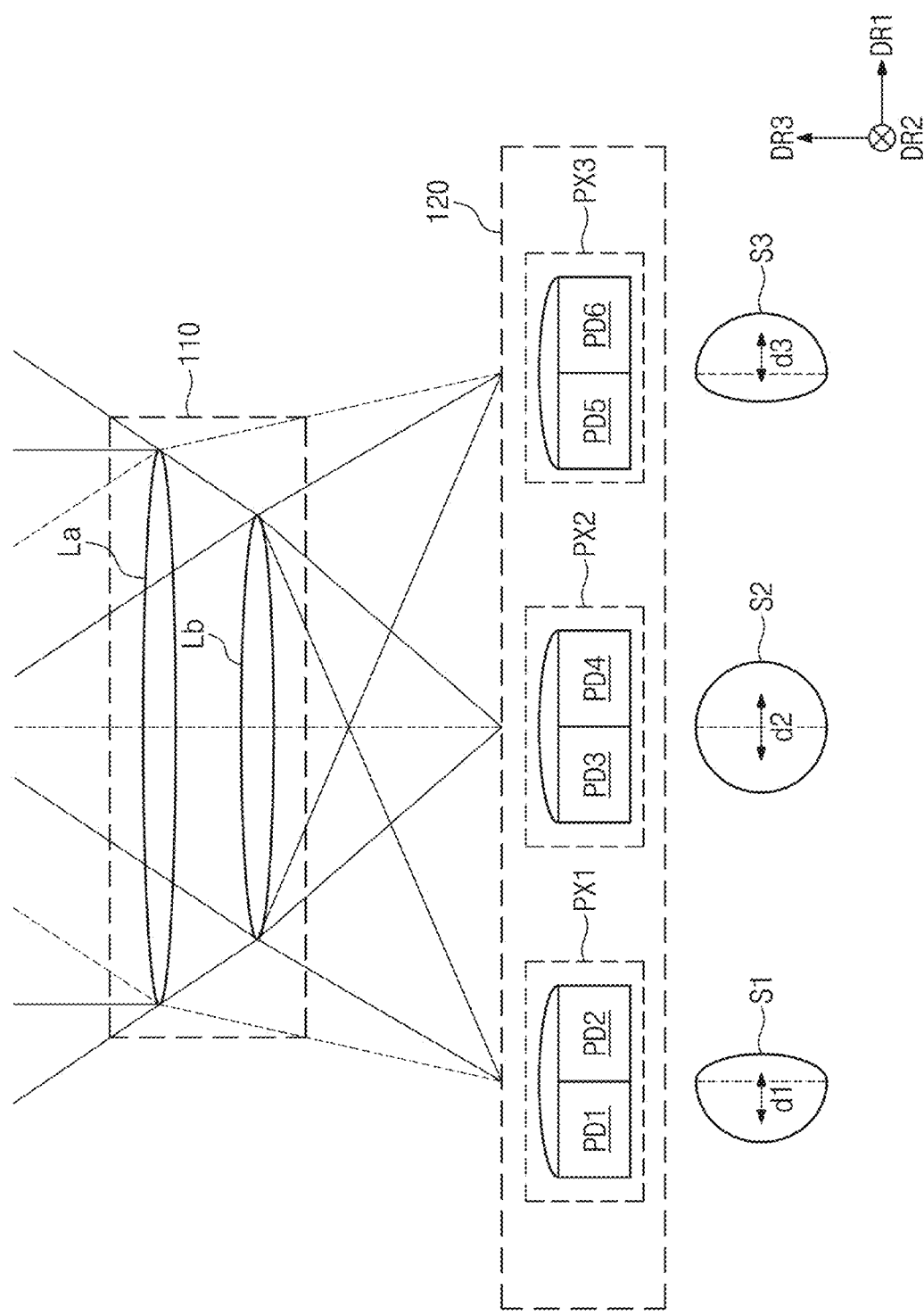
FIG. 7 is a diagram for describing disparity distortion according to a position of a pixel in an image processing system of FIG. 1.

FIG. 7 is a diagram for describing disparity distortion according to a position of a pixel in an image processing system of FIG. 1. The lens unit 110 and the image sensor 120 of FIG. 7 correspond to the lens unit 110 and the image sensor 120 of FIG. 1, respectively. The lens unit 110 may include a plurality of objective lenses. For convenience of description, it is assumed that the lens unit 110 includes first and second objective lenses La and Lb. For convenience of description, FIG. 7 will be described with reference to reference numerals/marks of FIGS. 1 and 2.

A light is transferred to the image sensor 120 through the first and second objective lenses La and Lb. The image sensor 120 includes the pixel array 121, and the pixel array 121 includes first to third pixels PX1 to PX3. It is assumed that the first to third pixels PX1 to PX3 are arranged in the first direction DR1. The first pixel PX1 may include the first and second photo diodes PD1 and PD2. The second pixel PX2 may include the third and fourth photo diodes PD3 and PD4. The third pixel PX3 may include the fifth and sixth photo diodes PD5 and PD6. Each of the first, third, and fifth photo diodes PD1, PD3, and PD5 corresponds to the first photo diode PD1 of FIG. 3, and each of the second, fourth, and sixth photo diodes PD2, PD4, and PD6 corresponds to the second photo diode PD2 of FIG. 3.

A disparity value corresponding to a distance of the same object may vary with positions of the first to third pixels PX1 to PX3. For example, a disparity value of an image generated based on a light sensed by the first pixel PX1 may be different from a disparity value of an image generated based on a light sensed by the second pixel PX2. The reason is that a disparity is distorted according to a position of a pixel. In particular, disparity distortion may increase in an edge area of the pixel array 121.

In detail, a shape of the lens unit 110 may be differently observed depending on a position of a pixel. For example, a shape of the second objective lens Lb viewed with respect to the second pixel PX2 at the center of the pixel array 121 may be circular. In contrast, the shape of the second objective lens Lb viewed with respect to the first pixel PX1 or the third pixel PX3 in an edge area of the pixel array 121 may be distorted.

First to third shapes S1 to S3 indicate shapes of the second objective lens Lb viewed with respect to the first to third pixels PX1 to PX3. Widths of the first and third shapes S1 and S3 in the first direction DR1 are smaller than a width of the second shape S2 in the first direction DR1. That is, first and third disparity values d1 and d3 that are disparity values in the edge areas may be smaller than a second disparity value d2. The processor 130 of FIG. 1 may manage calibration data for correcting disparity distortion according to a position of the pixel array 121. Assuming that an object at the same distance is captured, the first and third disparity values d1 and d3 may be calibrated to have the second disparity value d2.

In the case where each of the first to third pixels PX1 to PX3 corresponds to the pixel PXb of FIG. 4, disparity distortion may occur in the second direction DR2 as well as the first direction DR1. In this case, the calibration data may further include values for correcting the disparity distortion of the first direction DR1 and the disparity distortion of the second direction DR2. In addition, the calibration data may further include values for correcting disparity distortion of a direction (e.g., the fourth direction DR4 of FIG. 4) intersecting the first and second directions DR1 and DR2.

FIG. 8 is a diagram illustrating a disparity map for describing disparity distortion according to a position of a pixel. It may be understood that a disparity map of FIG. 8 is generated as a result of capturing a target image formed at a uniform distance. The target image may be configured to capture the same pattern at the same distance across a pixel array.

A disparity for each pixel that is calculated as a result of matching the first image LI and the second image RI of FIG. 5 to each other may be applied to the disparity map. Alternatively, in the case where the pixel PXb of FIG. 4 is applied to an image sensor, a disparity for each pixel that is calculated as a result of matching the first to fourth images to each other may be applied to the disparity map. For example, as a disparity value becomes smaller, an area corresponding to the disparity value may be displayed to be brighter in the disparity map. As described above, as a depth of an object decreases, a disparity value may decrease, and an area corresponding to the disparity value may be displayed more brightly. Because an ideal disparity map is generated based on the target image formed at the uniform distance, the overall brightness may be uniform.

A real disparity map that is generated based on the target image may not have uniform brightness. As described with reference to FIG. 7, a disparity may be distorted in an edge area, and thus, a value of the disparity may be smaller than a real value. As a result, as illustrated in FIG. 8, the real disparity map may be displayed more brightly as a distance from the center of the disparity map increases. In the case where a depth map is generated based on the real disparity map, a depth of an object may appear in the depth map to be smaller than a real depth in the edge area. Calibration data may be used to calibrate disparity distortion according to a position of a pixel so as to be the same as the ideal disparity map.

Figure 9:
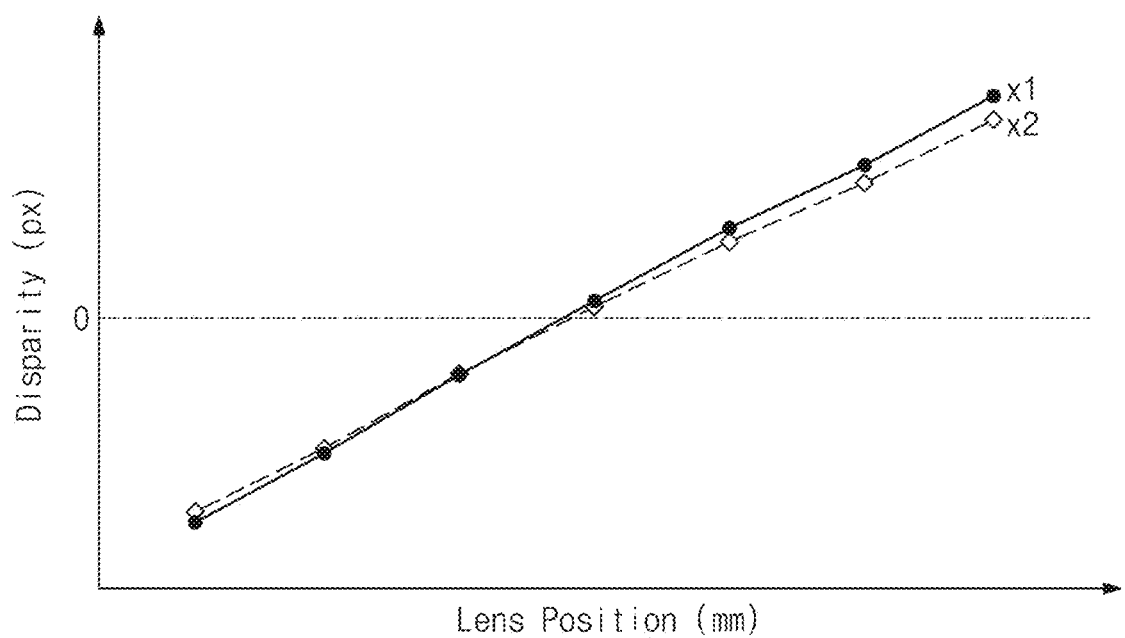
FIG. 9 is a graph for describing a relationship between a position of an objective lens and a disparity.

FIG. 9 is a graph for describing a relationship between a position of an objective lens and a disparity. Calibration data in which a relationship between a position of an objective lens and a disparity and disparity distortion according to a position of a pixel are considered will be more fully described with reference to FIG. 9. Referring to FIG. 9, a horizontal axis is defined as a position of an objective lens, and a vertical axis is defined as a magnitude of a disparity value of a pixel unit. The position of the objective lens may be understood as a distance between a movable objective lens and an image sensor. It may be understood that the disparity value indicates a relative magnitude to a preset disparity value of "0". It is assumed that a depth of an object is uniform.

As a distance between the objective lens and the image sensor increases, a disparity value may increase. However, a change rate of disparity may vary with a position of a pixel. A first function x1 indicates a disparity value corresponding to a pixel at a first position, and a second function x2 indicates a disparity value corresponding to a pixel at a second position. The first position and the second position have different displacements in the first direction DR1 with respect to the pixel array 121 of FIG. 1. Disparity distortion according to a position of a pixel may be one factor that makes the change rates of disparity of the first function x1 and the second function x2 different.

Referring to the first function x1 and the second function x2, a disparity may change linearly as a position of the objective lens changes. The first function x1 and the second function x2 may approximate to a linear function, and may be defined as Equation 1.

$$\Delta(l, x) = \gamma(x) \cdot (l - l_0) + \Delta(l_0, x) \qquad [\text{Equation 1}]$$

$$\gamma(x) = \frac{\Delta(l_1, x) - \Delta(l_0, x)}{l_1 - l_0}$$

Referring to Equation 1, $\Delta(l,x)$ may indicate a disparity value when a pixel is at position "x" in the first direction DR1 and the objective lens is at position "l". "$l_0$" may be defined as a target position of the objective lens, and the target position may be defined as a distance between the objective lens and the image sensor, which is used as a reference when calibration data are generated. $\Delta(l_0,x)$ may indicate a disparity value when a pixel is at position "x" and the objective lens is at the target position. $\gamma(x)$ indicates a disparity change rate according to a position change of the objective lens, which is associated with the pixel at position "x". The disparity change rate may have a uniform value with regard to a specific pixel position.

Calibration data may include a disparity change rate $\gamma(x)$ for each position of a pixel, a target position $l_0$, and disparity information corresponding to the target position $l_0$. Here, a position of a pixel may be specified as, but is not limited to, a position of an individual pixel, and may be used as the concept of a pixel range including positions of a plurality of adjacent pixels. Disparity information may include, but is not limited to, the disparity value $\Delta(l_0,x)$, and may include a deviation between an ideal disparity value and a real disparity value.

The image processing system 100 may generate calibration data in advance for the purpose of generating a depth map. To this end, the image processing system 100 may capture a target image through an objective lens of the target position $l_0$ (a first lens position), thus generating second image data. Also, the image processing system 100 may capture the same target image through an objective lens of a second lens position $l_1$ different from the target position $l_0$, thus generating first image data. The image processing system 100 may generate the disparity value $\Delta(l_0,x)$ based on the first image data and may generate the disparity value $\Delta(l_1,x)$ based on the second image data. The disparity change rate $\gamma(x)$ may be calculated by applying the first and second lens positions $l_0$ and $l_1$ and the disparity values $\Delta(l_0,x)$ and $\Delta(l_1,x)$ to Equation 1, and the calibration data may be generated.

In addition, in the case where a pixel is the pixel PXb of FIG. 4, disparity change rates corresponding to the second direction DR2 and the fourth direction DR4 as well as the first direction DR1 and disparity information may be further generated. In this case, the calibration data may include the target position $l_0$, disparity change rates (e.g., $\gamma(x)$ and $\gamma(y)$) corresponding to various directions, and disparity information (e.g., $\Delta(l_0,x)$ and $\Delta(l_0,y)$) corresponding to the target position $l_0$.

Figure 10:
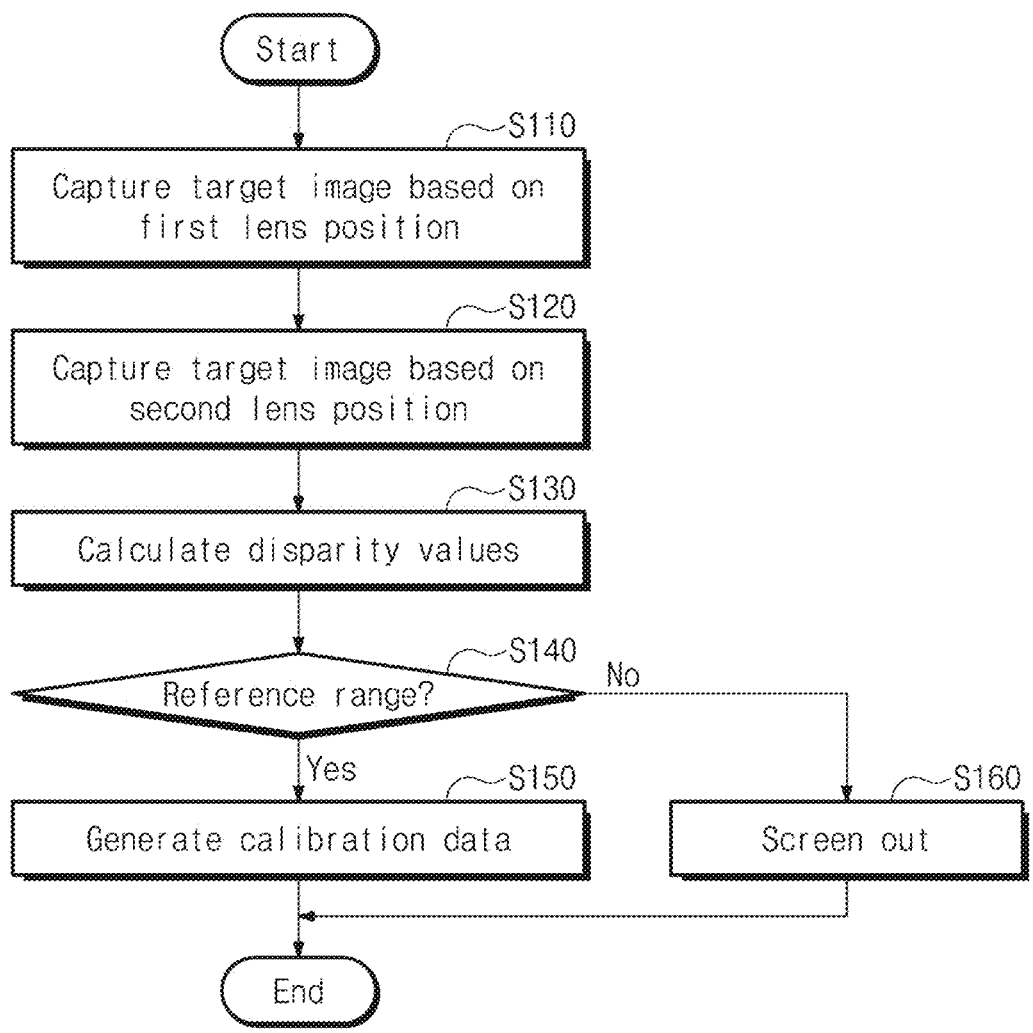
FIG. 10 is a flowchart for describing a method of generating calibration data described with reference to FIG. 9.

FIG. 10 is a flowchart for describing a method of generating calibration data described with reference to FIG. 9. The method of FIG. 10 may be performed by using the image processing system 100 of FIG. 1, and calibration data generated through the method may be managed by processor 130 in advance before a depth map for an external image is generated. For convenience of description, FIG. 10 will be described with reference to reference marks/numerals of FIG. 1.

In operation S110, the image processing system 100 captures a target image based on a first lens position. The first lens position may mean a distance between a movable objective lens and the image sensor 120. For example, the first lens position corresponds to the target position $l_0$ or the first lens position of FIG. 10. The target image corresponds to the target image described with reference to FIG. 8. As a capturing result, the image processing system 100 may generate two or more images having different phase differences. The images are described as first image data.

In operation S120, the image processing system 100 captures the target image based on a second lens position. For example, the second lens position corresponds to the target position $l_1$ of FIG. 10 and may be different from the first lens position. The target image is the same as the target image described in operation S110. As a capturing result, the image processing system 100 may generate two or more images having different phase differences. The images are described as second image data.

In operation S130, the image processing system 100 calculates disparity values of the first image data and the second image data. Based on the first image data, the image processing system 100 may calculate disparity values (e.g., a first disparity value) corresponding to the first lens position along a position of a pixel. The image processing system 100 may calculate disparity values (e.g., a second disparity value) corresponding to the second lens position along a position of a pixel.

In operation S140, the image processing system 100 may determine whether the first disparity value is included in a first reference range and may determine whether the second disparity value is included in a second reference range. For example, in the case where the first lens position corresponds to the position of the objective lens in the normal mode of FIG. 6, the first reference range may include the first disparity range dra. In the case where the second lens position corresponds to the position of the objective lens in the infinity mode of FIG. 6, the second reference range may include the second disparity range drb. When the first and second disparity values are respectively included in the first and second reference ranges, operation S150 is performed. When the first and second disparity values are respectively out of the first and second reference ranges, operation S160 is performed.

In operation S150, the image processing system 100 generates calibration data. The image processing system 100 may calculate a disparity change rate according to a position change of an objective lens by applying the first and second lens positions and the first and second disparity values to Equation 1. The image processing system 100 may manage the first lens position (or the second lens position), the first disparity value (or the second disparity value), and the disparity change rate as the calibration data. The calibration data may be stored in a memory (not illustrated) of the image processing system 100, and may be used later when a depth map is generated.

In operation S160, the first and second disparity values that are out of the first and second reference ranges are screened out. For example, that a disparity value is out of a reference range may mean that an area captured from the first image does not be present in the second image or that an area captured from the second image does not be present in the first image. Because a phase difference fails to be calculated with regard to this image area, the image area may be screened out.

Figure 11:
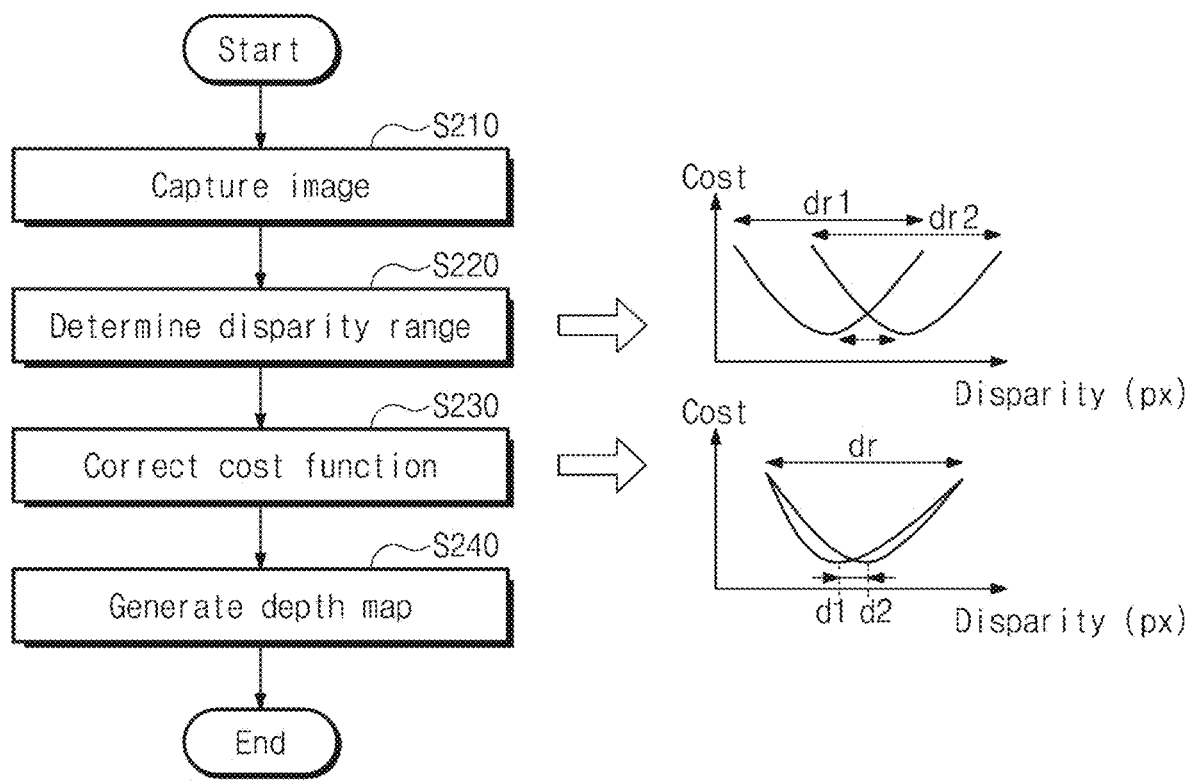
FIG. 11 is a flowchart for describing a method of generating a depth map by using calibration data described with reference to FIG. 9.

FIG. 11 is a flowchart for describing a method of generating a depth map by using calibration data described with reference to FIG. 9. The method of FIG. 11 may be performed by using calibration data that are generated through the image processing system 100 of FIG. 1 and the method of FIG. 10. For convenience of description, FIG. 11 will be described with reference to reference marks/numerals of FIG. 1.

In operation S210, the image processing system 100 captures an external image. When the external image is captured, at least one objective lens of the lens unit 110 may move by the auto focus module 131. For example, the image processing system 100 may generate first and second images by capturing the external image by using a first photo diode and a second photo diode. The auto focus module 131 may adjust a position of the objective lens based on a phase difference (or a disparity) between the first and second images such that an object comes into focus.

For example, as described with reference to FIG. 6, the auto focus module 131 may determine whether a disparity calculated by the first and second images is included in a reference disparity. When the disparity is not included in the reference disparity, the auto focus module 131 may generate focus information to move a position of the objective lens. In addition, in the case where the pixel PXb of FIG. 6 is applied to the image sensor 120, the auto focus module 131 may move the objective lens in consideration of all disparities calculated by first to fourth images.

In operation S220, the image processing system 100 determines a disparity range based on the position of the objective lens. The disparity range may be estimated based on calibration data. For example, a disparity range according to the position of the objective lens may be calculated with reference to a disparity change rate of the calibration data. As described with reference to FIG. 6, the disparity range may vary with a position change of the objective lens. As the position of the objective lens becomes closer to the image sensor 120, an upper limit and a lower limit of the disparity range may decrease.

Referring to a cost function for calibrating disparity distortion, the disparity range may be shifted according to the position of the objective lens. For example, in the case where an object is at a short distance, the position of the objective lens may move away from the image sensor 120. In this case, the disparity range may be changed from the first disparity range dr1 to the second disparity range dr2.

In operation S230, the image processing system 100 may correct the cost function for the purpose of calibrating disparity distortion according to a position of a pixel. In operation S220, within the determined disparity range dr, the disparity value may be adjusted based on the calibration data. The calibration data include disparity information for each position of a pixel. The image processing system 100 may correct the cost function for each area based on the disparity information for each position of a pixel.

A disparity corresponding to the smallest value in the cost function may be an estimated disparity value. As described with reference to FIG. 7, the disparity value d1 of the edge area may be smaller than the real disparity value d2. The image processing system 100 may apply the distorted disparity value to the cost function to adjust a disparity value corresponding to the edge area. The accuracy with which a depth map is generated may be improved by correcting the cost function.

In operation S240, the image processing system 100 may generate a depth map based on the cost function determined through operation S220 and operation S230. The depth module 132 may convert the disparity into depth information, based on the disparity range estimated in operation S220 and the disparity value adjusted in operation S230. A depth map corresponding to the external image may be generated based on this depth information.

FIG. 11 describes how to generate a depth map by using a corrected cost function, after the cost function is first corrected based on the calibration data. For example, the image processing system 100 may first generate a depth map without consideration of calibration data and may then post-process the depth map based on the calibration data.

According to an embodiment of the disclosure, a depth map with improved accuracy may be generated by considering a position change of an objective lens according to an auto-focus function at the same time with calibrating disparity distortion according to a position of a pixel.

While the disclosure has been described with reference to exemplary embodiments thereof, it will be apparent to those of ordinary skill in the art that various changes and modifications may be made thereto without departing from the spirit and scope of the disclosure as set forth in the following claims.

What is claimed is:

1. An image processing system comprising:
   a movable lens configured to transfer an external light;
   an image sensor comprising a pixel array configured to generate an image signal based on the light, the image sensor configured to generate image data based on the image signal; and
   a processor configured to generate focus information for controlling a position of the movable lens and to generate a depth map based on calibration data and the image data,
   wherein the calibration data comprises a value corresponding to a magnitude of disparity distortion based on the position of the movable lens and a position of a pixel included in the pixel array, and
   wherein the magnitude of disparity distortion increases as the position of the pixel is located farther away from a center of the pixel array.

2. The image processing system of claim 1, wherein the pixel comprises:
   a first photo diode configured to generate a first signal based on the light; and
   a second photo diode configured to generate a second signal based on the light,
   wherein the image data comprises a first image generated based on the first signal and a second image generated based on the second signal, and
   wherein the processor is further configured to calibrate a phase difference between the first image and the second image based on the calibration data to generate the depth map.

3. The image processing system of claim 2, wherein the processor is further configured to generate the focus information based on the phase difference.

4. The image processing system of claim 1, wherein, based on the calibration data, the processor is further configured to generate a disparity range corresponding to the position of the movable lens and select a portion of image data corresponding to the disparity range.

5. The image processing system of claim 4, wherein, as the position of the movable lens moves away from the image sensor, an upper limit and a lower limit of the disparity range increase.

6. The image processing system of claim 1, wherein the processor is further configured to adjust a disparity value, based on the calibration data and the position of the pixel.

7. The image processing system of claim 6, wherein, as the position of the pixel is farther away from the center of the pixel array, a magnitude to which the disparity value is adjusted increases.

8. The image processing system of claim 1, wherein the calibration data comprises a target position of the movable lens, disparity information according to the position of the pixel at the target position, and a disparity change rate according to a position change of the movable lens.

9. The image processing system of claim 1, wherein the pixel comprises:
   a first photo diode;
   a second photo diode disposed adjacent to the first photo diode in a first direction;
   a third photo diode disposed adjacent to the first photo diode in a second direction; and
   a fourth photo diode disposed adjacent to the second photo diode in the second direction,
   wherein the image data comprises first to fourth images respectively corresponding to the first to fourth photo diodes, and
   wherein the processor is further configured to calibrate at least one of a first phase difference between the first image and the second image, a second phase difference between the first image and the third image, and a third phase difference between the first image and the fourth image based on the calibration data, to generate the depth map.

10. The image processing system of claim 9, wherein the calibration data comprises a target position of the movable lens, disparity information according to the position of the pixel at the target position, and a disparity change rate according to a position change of the movable lens, wherein the disparity information comprises a disparity calibration value corresponding to at least one of the first to third phase differences, and wherein the disparity change rate comprises a disparity change rate value corresponding to at least one of the first to third phase differences.

11. An operating method of an image processing system, the method comprising:

capturing a target image through a movable lens at a first position to generate first image data;

capturing the target image through the movable lens at a second position to generate second image data;

calculating a first disparity value based on a position of a pixel included in an image sensor, and based on the first image data;

calculating a second disparity value based on the position of the pixel, and based on the second image data;

calculating a disparity change rate corresponding to a magnitude of disparity distortion according to a position of the movable lens, based on the first and second disparity values; and generating calibration data based on the disparity change rate, wherein the magnitude of disparity distortion increases as the position of the pixel is located farther away from a center of the image sensor.

12. The method of claim 11, wherein the first image data comprises a first image generated from a first photo diode of the pixel and a second image generated from a second photo diode of the pixel, wherein the second image data includes a third image generated from the first photo diode and a fourth image generated from the second photo diode, wherein the first disparity value is calculated based on a first phase difference between the first image and the second image of the first image data, and wherein the second disparity value is calculated based on a second phase difference between the third image and the fourth image of the second image data.

13. The method of claim 11, further comprising:

determining whether the first disparity value is within a first disparity range corresponding to the first position;

determining whether the second disparity value is within a second disparity range corresponding to the second position, and generating the calibration data corresponding to the pixel, when the first disparity value is within the first disparity range or when the second disparity value is within the second disparity range.

14. The method of claim 11, wherein the calibration data further comprise the first position and the first disparity value.

15. The method of claim 11, further comprising:

capturing an external image through the movable lens at a third position to generate third image data; and generating a depth map corresponding to the external image, based on the calibration data and the third image data.

16. An operating method of an image processing system, the method comprising:

capturing an external image with an image sensor comprising a plurality of pixels in a pixel array to generate image data;

generating a disparity range corresponding to a magnitude of disparity distortion, based on calibration data and a position of a movable lens in capturing the external image;

generating a cost function corresponding to the disparity range; and generating a depth map, based on the cost function and the calibration data, wherein the calibration data comprises a disparity change rate according to a position of a pixel, among the plurality of pixels, and the position of the movable lens, and wherein the magnitude of disparity distortion increases as the position of the pixel is located farther away from a center of the pixel array.

17. The method of claim 16, wherein the generating of the image data comprises:

capturing the external image with a first photo diode included in each of the plurality of pixels to generate a first image;

capturing the external image with a second photo diode included in each of the plurality of pixels to generate a second image;

adjusting a distance between the movable lens and the image sensor, based on a phase difference between the first image and the second image; and capturing the external image, through the movable lens based on the adjusted distance.

18. The method of claim 16, wherein the generating of the disparity range comprises:

estimating the disparity range corresponding to the position of the movable lens, based on the disparity change rate.

19. The method of claim 16, wherein the generating of the depth map comprises:

calculating a disparity value according to the position of the plurality of pixels, based on the disparity change rate;

correcting the cost function, based on the disparity value; and calculating the depth map, based on the corrected cost function and the image data.

20. The method of claim 16, wherein the generating of the depth map comprises:

generating a first depth map based on the image data and the cost function; and calibrating the first depth map to a second depth map, based on the calibration data, wherein the depth map is the second depth map.

* * * * *